United States Patent

Kinzer et al.

(10) Patent No.: US 7,955,969 B2
(45) Date of Patent: Jun. 7, 2011

(54) ULTRA THIN FET

(75) Inventors: Daniel M. Kinzer, El Segundo, CA (US); Michael A. Briere, Manhattan Beach, CA (US); Alexander Lidow, Hermosa Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 36 days.

(21) Appl. No.: 11/530,166

(22) Filed: Sep. 8, 2006

(65) Prior Publication Data

US 2007/0082480 A1    Apr. 12, 2007

Related U.S. Application Data

(60) Provisional application No. 60/715,356, filed on Sep. 8, 2005.

(51) Int. Cl.
 *H01L 21/4763* (2006.01)

(52) U.S. Cl. ............... 438/629; 438/977; 257/E21.597; 257/E21.6

(58) Field of Classification Search .......... 438/459, 438/629, 977; 257/621, 773, 774, E21.597, 257/E21.6
See application file for complete search history.

(56) References Cited

U.S. PATENT DOCUMENTS

| 5,004,705 | A | * | 4/1991 | Blackstone | 438/455 |
|---|---|---|---|---|---|
| 5,591,678 | A | * | 1/1997 | Bendik et al. | 438/459 |
| 6,331,467 | B1 | | 12/2001 | Brown et al. | |
| 2003/0203552 | A1 | * | 10/2003 | Blanchard | 438/200 |
| 2005/0001268 | A1 | * | 1/2005 | Baliga | 257/341 |
| 2006/0035442 | A1 | * | 2/2006 | Ilicali et al. | 438/459 |

* cited by examiner

*Primary Examiner* — Michael S Lebentritt
*Assistant Examiner* — Daniel Whalen
(74) *Attorney, Agent, or Firm* — Farjami & Farjami LLP

(57) ABSTRACT

Processes are described for forming very thin semiconductor die (1 to 10 microns thick) in which a thin layer of the upper surface of the wafer is processed with junction patterns and contacts while the wafer bulk is intact. The top surface is then contacted by a rigid wafer carrier and the bulk wafer is then ground/etched to an etch stop layer at the bottom of the thin wafer. A thick bottom contact is then applied to the bottom surface and the top wafer carrier is removed. All three contacts of a MOSFET may be formed on the top surface in one embodiment or defined by the patterning of the bottom metal contact.

18 Claims, 5 Drawing Sheets

ULTRA THIN FET

RELATED APPLICATION

This application is based on and claims the benefit of U.S. Provisional Application Ser. No. 60/715,356, filed on Sep. 8, 2005, entitled FOIL FET, to which a claim of priority is hereby made and the disclosure of which is incorporated by reference.

FIELD OF THE INVENTION

This invention relates to MOSgated devices and more specifically relates to a low voltage MOSFET in which the substrate is almost completely eliminated.

BACKGROUND OF THE INVENTION

MOSgated devices such as MOSFETs, IGBTs and the like are well known. Vertical conduction MOSgated devices are usually formed in a relatively thick wafer or die, which may have a thickness of several hundred microns. A thin top junction receiving layer which may be only about 3μ thick (for low voltage devices) is located on the top surface of the wafer. Conduction in such devices, when the device is on, is from a source electrode on the top surface to a drain electrode on the bottom surface. The resistance $R_{DSON}$ through the thick wafer substrate adds to the device on resistance.

It is desired to reduce this on resistance $R_{DSON}$ and it is known to thin the wafers to about 60 microns for this purpose. The resulting device is mechanically fragile and hard to handle.

It would be desirable to even more drastically thin the wafer while still providing sufficient mechanical strength so that the wafer and the die singulated therefrom can be easily handled during fabrication and packaging.

BRIEF DESCRIPTION OF THE INVENTION

In accordance with the invention, a wafer is thinned to the thickness of a thin foil, for example, to 3 microns for a 25 volt device, and could be thinned within the range of 1 micron to 10 microns.

The top surface of the foil has a relatively massive copper electrodes (20 microns thick, for example), and the bottom of the wafer may also have a similar massive (20 microns, for example) bottom electrodes to lend mechanical rigidity to the silicon foil.

Vias may extend through the thin foil of silicon to bring top contacts to the bottom of the foil as desired.

In one embodiment of the invention, one or both of the source and gate electrodes wrap around the chip edge to be available at either side thereof.

A novel process for producing this result is also disclosed.

DESCRIPTION OF THE PREFERRED EMBODIMENTS

Figure 1:
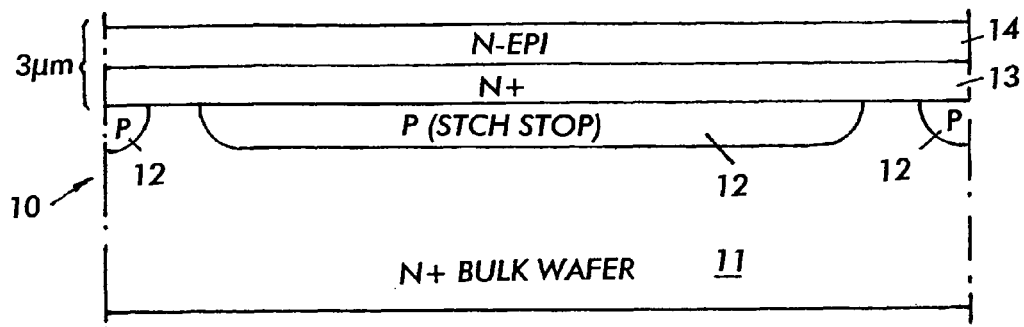
FIG. 1 shows a small segment of a wafer prepared in accordance with the invention, and particularly shows a single die position on the wafer.

FIG. 1 shows a starting wafer 10 which has a thick (e.g., 300 to 550 micron) N+ bulk region 11 containing a P type diffused etch stop region 12 and an N+ drain diffusion region 13. An N− epitaxially grown layer 14 is formed atop the N+ layer 13. The thickness of the N+ layer 13 and the N− epitaxial layer 14 defines a very thin layer, or foil, about 1 to 10 microns thick, depending on the breakdown voltage needed. For a 25 volt device, for example, the thickness would be about 3 microns.

Figure 2:
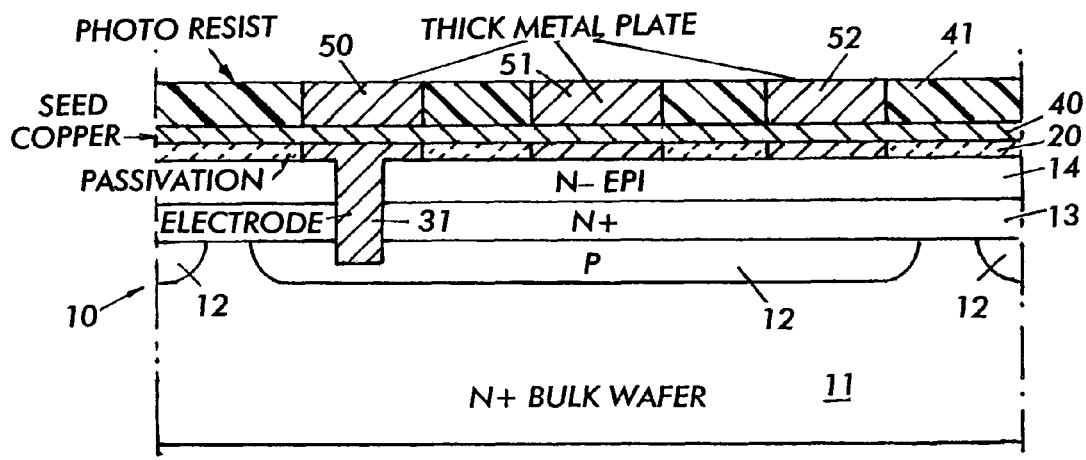
FIG. 2 shows the wafer of FIG. 1 after the formation of device junctions (not shown) and the device electrodes.

The desired implants and diffusions are then carried out to form the desired FET junction pattern in the N− epi layer 14. The top surface of the device is passivated as by passivation layer 20 (FIG. 2). Any desired passivation is used, such as TEOS, PECVD oxides, HDP oxides, SACVD oxide, PSG, BPSG, $Si_3N_4$ etc. If a top drain contact is desired on the same surface as the gate and source electrodes, a via opening 30, filled with copper 31, or the like may be formed.

A thin copper seed layer 40 (FIG. 2) is then formed over the full upper surface of the wafer (FIG. 2) and a photo-resist layer 41 is deposited atop the seed layer 40 and is patterned to form contact for electrodes on the silicon. A thick metal plate, for example, copper which may be 20 microns thick, is then deposited into the area exposed by openings in the photoresist (FIG. 2) as by any desired plating or deposition process, defining contacts 50, 51, 52 which may be drain, gate and source contacts respectively.

Figure 3:
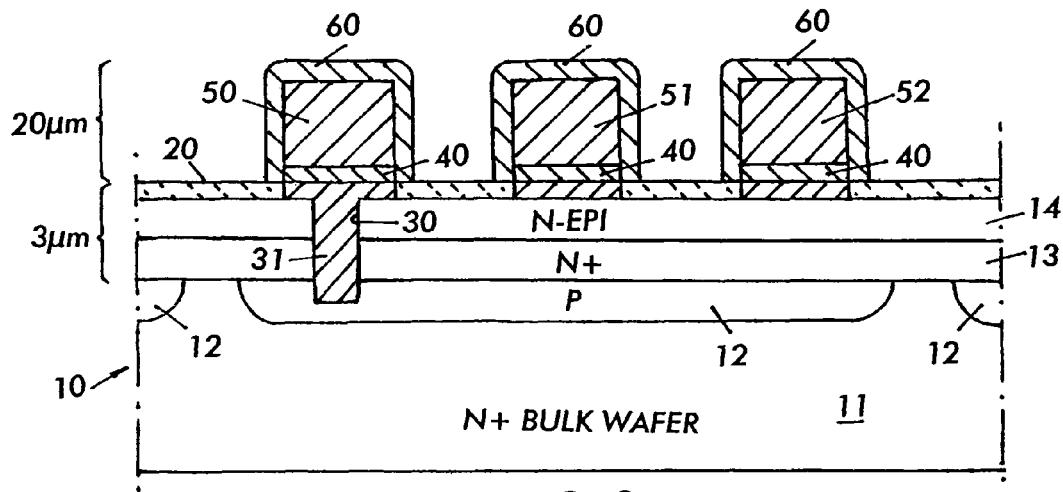
FIG. 3 shows the wafer of FIG. 2 after a gold flash coating of the source, drain and gate electrodes, all on the top surface of the wafer/die.

Thereafter, as shown in FIG. 3, the photoresist 41 is stripped, the exposed copper seed 40 is stripped and a gold flash 60 (or other precious metal) is applied to the massive copper contacts 50, 51, 52 for solderability.

Figure 4:
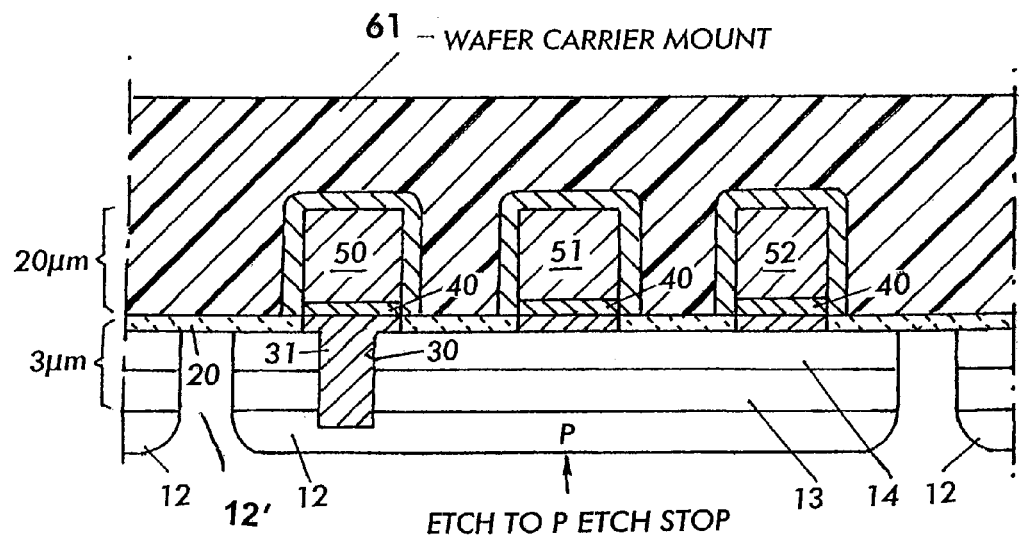
FIG. 4 shows the application of a wafer carrier mount to the device top surface and the subsequent removal of the bulk portion of the wafer.

As next shown in FIG. 4, a soft or hard wafer carrier 61 is adhered to the top surface of the wafer and the N+ substrate 11 is ground back and then etched away to the P type etch stop 12. Note that the wafer may be singulated where the P etch stop layer is interrupted 12'.

During the above process, the wafer strength is derived from the wafer carrier mount 61 and the wafer 10 is easily handled in conventional wafer fabrication equipment.

The P type etch stop layer 12 is then removed (FIG. 5) and oxides are removed from any vias formed during the etch back process.

Figure 5:
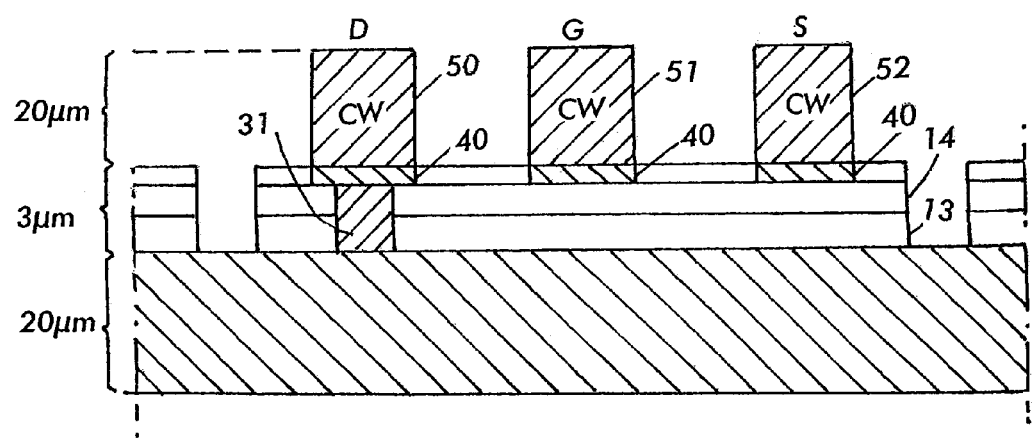
FIG. 5 shows the device of FIG. 4 in which a rigid conductive back plate is fixed to the bottom of the wafer, and the wafer carrier mount is removed.

Thereafter, as shown in FIG. 5, an electroless backside contact 15 (about 20 microns thick) is formed on the N+ layer 13, completing the processed wafer.

Figure 4A:
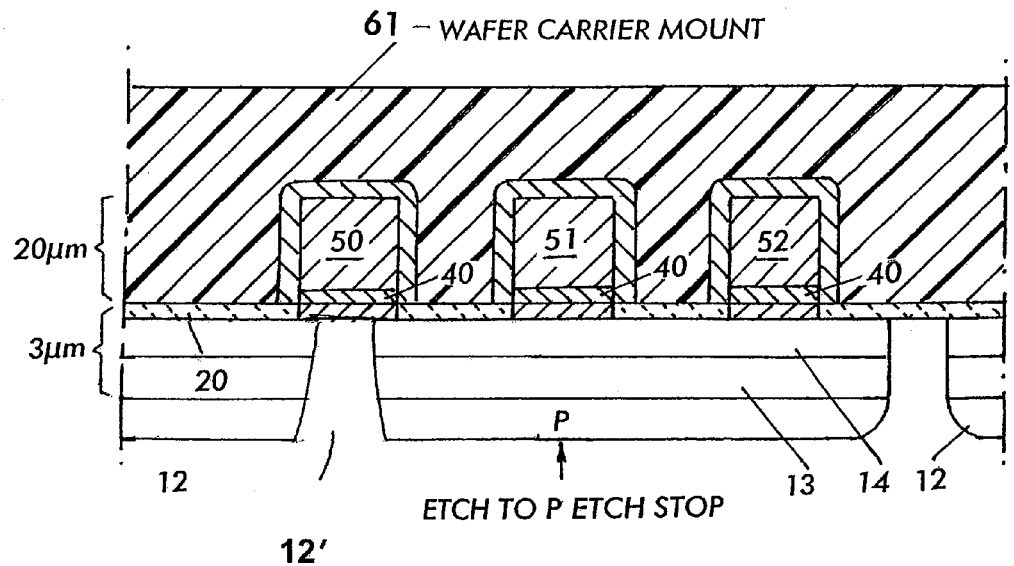
FIGS. 4A and 4B illustrate an alternative method according to the present invention.
Figure 4B:
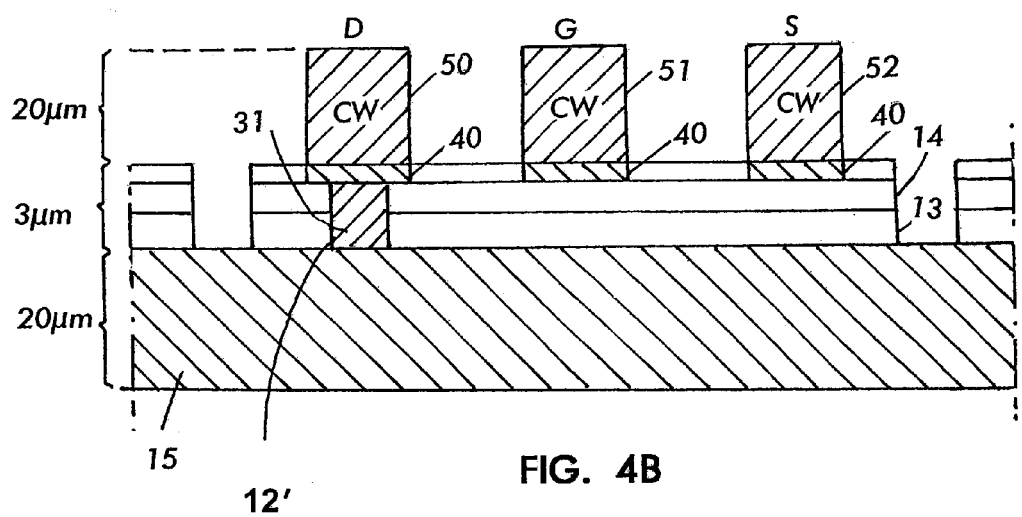
Figure 6:
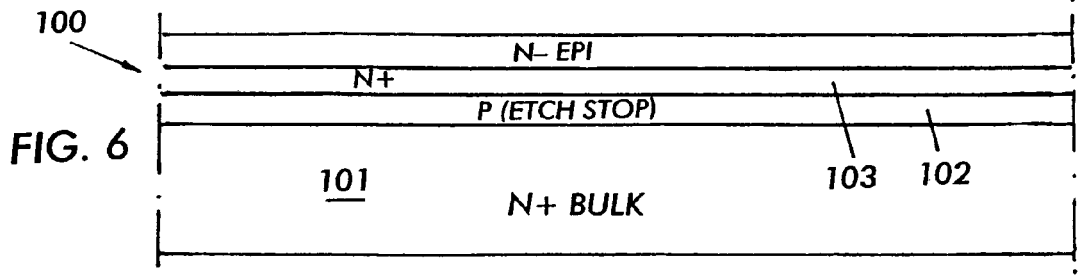
FIG. 6 shows the starting wafer made in accordance with a second embodiment of the invention.

Alternatively, some interruptions 12' can be provided and used as vias to make electrical connection between back side contact 15 and a front side (for example, drain contact) 50. Referring to FIGS. 4A and 4B, an interruption 12' is provided preferably under the location of front drain contact 50, and then filled with metal when back side contact 15 is formed as shown by FIG. 4B. Note that as a result etching a via from the front and filling the same with copper or the like material is obviated.

Note that back side contact 15 can be formed by a variety of methods including electroless titanium, nickel, copper, or gold plating, sputtering a seed layer and electroplating of the desired metal, sputtering or evaporating the desired metal.

The wafer carrier mount 61 is then removed. Note that all electrodes are available for connection at the top of the wafer.

FIGS. 6 to 11 show a second embodiment of the invention. Thus, in FIG. 6, the starting wafer 100 is like that of FIG. 1 except that the etch stop layer 102 is continuous across the wafer. Thus, the wafer 100 consists of a thick N+ bulk 101, the P type etch stop layer 102, and a thin N+ drain diffusion layer 103. The N− epitaxially grown layer 104 is formed atop N+ region 103.

A suitable set of implants and diffusions are formed in the N− epi layer 104 to form the desired FET or other device. The thickness of layers 103 and 104 may be about 1 to 10 microns and are non-self supporting in the absence of the N+ bulk 101.

Figure 7:
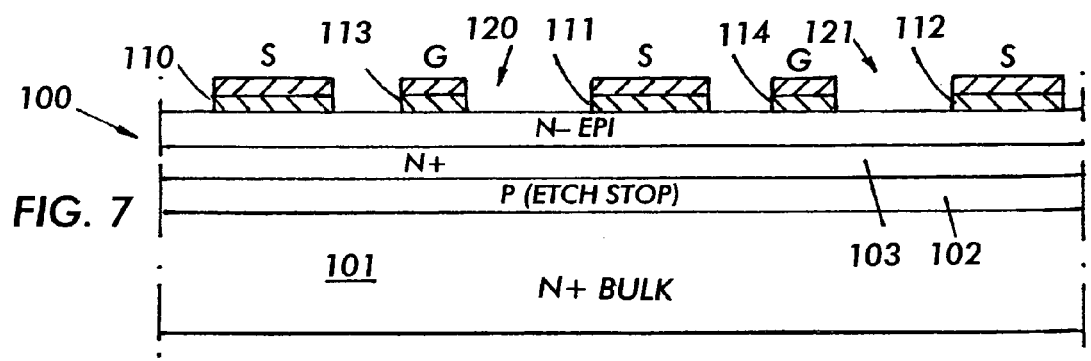
FIG. 7 shows the wafer of FIG. 6 after the formation of junctions for a plurality of die and shows two full die widths.

Thereafter, and as shown in FIG. 7, source and gate contacts are formed, shown for several adjacent die, as source contacts 110, 111, 112 and gate contacts 114, 115 (for the die with source contacts 110, 111 respectively). The contacts may be plated and etched in streets 120, 121.

Figure 8:
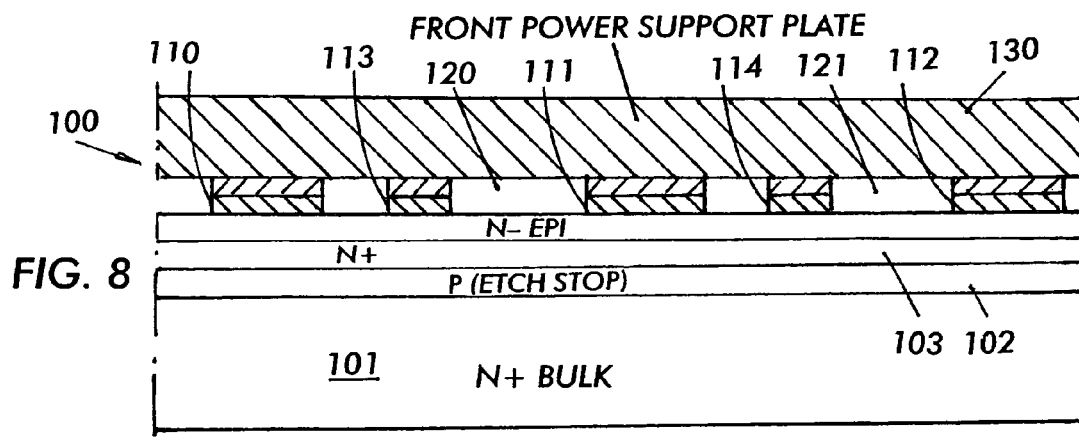
FIG. 8 shows the wafer of FIG. 7 after the application of a front cover support plate (or wafer carrier mount).

As next shown in FIG. 8, a thick, rigid front cover support plate 130 (like the wafer carrier mount 61 of FIG. 4) is removably adhered to the surface defined by tops of the front contacts 110 to 114 and the N+ bulk region 101 is removed by a grind/etch step, back to the etch stop layer 102. The wafer carrier 61 provides the necessary strength for the wafer after bulk 104 is removed.

Figure 9:
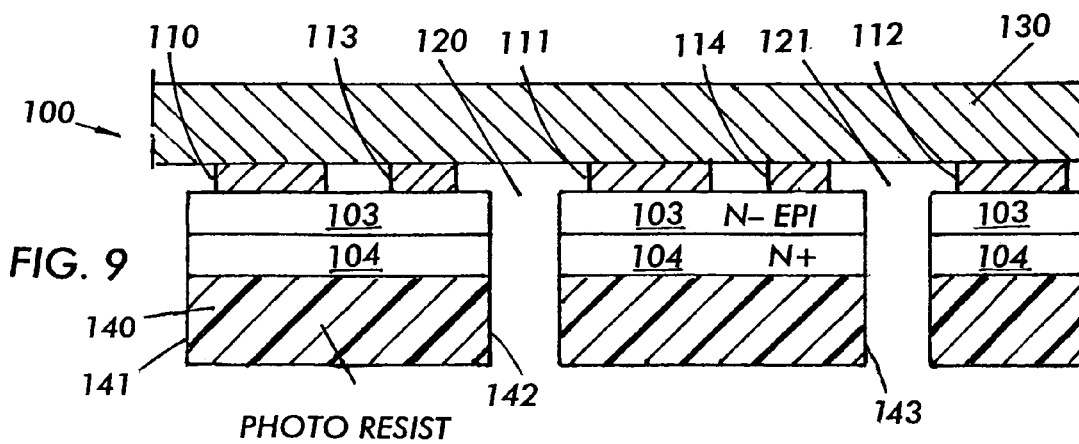
FIG. 9 shows the wafer of FIG. 8 after the removal of the N+ bulk material and P etch stop and a subsequent photolithography step to form openings between adjacent die in the wafer.

Thereafter and as shown in FIG. 9, the P type etch stop layer 102 is removed (or converted to the N type) and a photoresist 140 is applied to the back layer and is opened at windows 141, 142, 143 which define the peripheries of adjacent die. The exposed silicon layers 103 and 104 are then etched, as shown in FIG. 9, in a street pattern.

Figure 10:
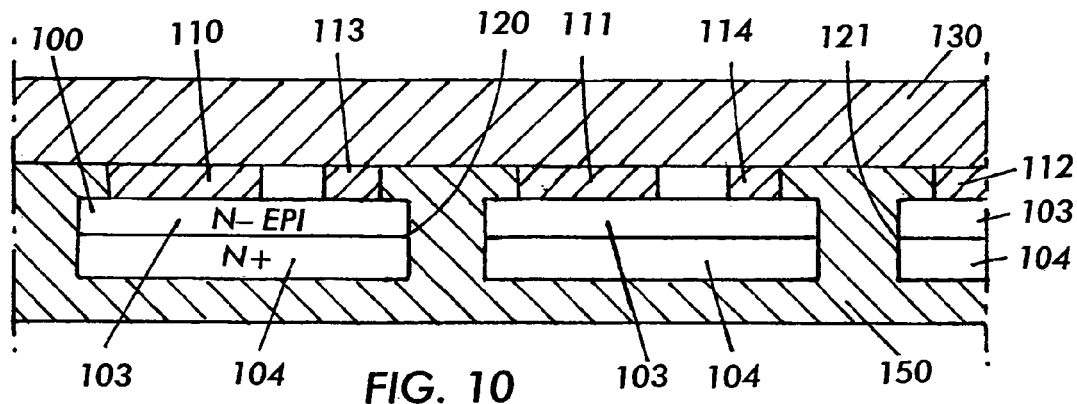
FIG. 10 shows the wafer of FIG. 9 after the deposition of a back contact which enters the photolithographically formed openings in the street areas of the wafer.

Copper 150 is then plated or otherwise applied to the back surface and into the openings in the streets defined by windows 141, 142, 143. A thick copper mass, for example, 10 to 20 microns thick, is left on the bottom surface of the wafer. Note that the copper 150 within the streets contacts the source and gate metals on the top surface as shown in FIG. 10.

Copper 150 is then etched from the backside of the wafer foil as desired, depending on the final device desired.

Thereafter, the backside is mounted to a suitable carrier and the front carrier 130 is removed. Metal 150 which is preferably copper, but can be any suitable conductor, has sufficient strength to allow the subsequent handling of the wafer and the die diced therefrom.

Figure 11:
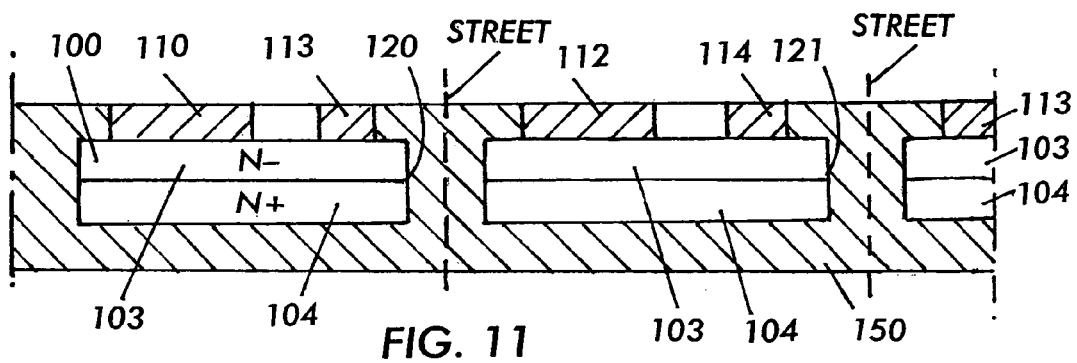
FIG. 11 shows the wafer of FIG. 10 after the removal of the wafer carrier mount.
Figure 12:
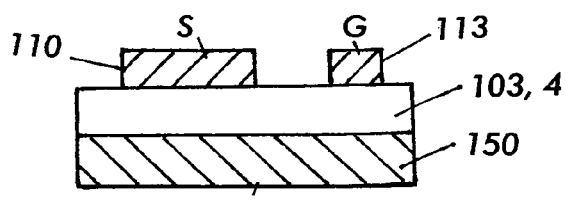
FIGS. 12, 13 and 14 shows three formats for die singulated from the wafer of FIG. 11, depending on the finishing etch of the back copper.
Figure 14:
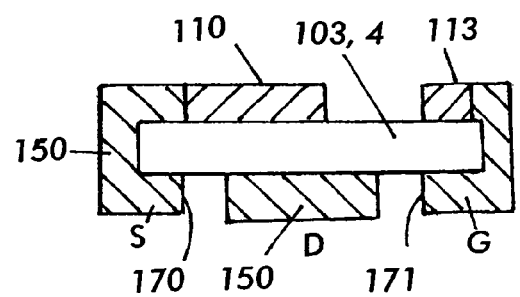
Figure 13:
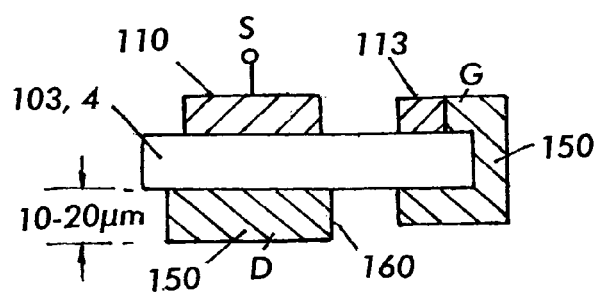

The die which are formed and singulated at streets 120, 121 can have the structures, for example, of FIG. 12, 13 or 14, depending on the etch of the back contact 150 in FIG. 11.

Thus, the die can have the traditional geometry of FIG. 12, with source 110 and gate 113 contacts on the top surface and the thick metal drain 150 on the bottom surface.

Alternatively, the die may have the structure of FIG. 13 in which the back contact is separated at area 160 and the gate contact 113 is extended to the bottom surface of the die through metal 150 in the street which is retained for this purpose.

A very useful geometry is that shown in FIG. 14 in which two separations 170, 171 are formed in the bottom metal 150, with portions of metal 150 extending around the edge of the silicon die 103, 104 and contacting source 110 and gate 113 respectively. This then presents the source, drain and gate electrode on the bottom surface of the die, for simplified die mounting on a support surface.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method for manufacturing a semiconductor device comprising:
   forming an etch stop layer in a top surface of a wafer;
   forming a thin junction receiving layer atop said etch stop layer;
   forming a junction pattern in said thin junction receiving layer;
   forming spaced contacts atop said junction pattern;
   attaching a wafer carrier mount to a top surface of said junction pattern, wherein said wafer carrier mount functions to provide a mechanical wafer strength to said wafer;
   removing a bulk of said wafer from a bottom of said wafer to said etch stop layer;
   metallizing an exposed bottom surface of said junction pattern with a conductive layer; and
   removing said wafer carrier mount.

2. The method of claim 1, wherein said thin junction receiving layer comprises a layer of epitaxially grown silicon.

3. The method of claim 1, wherein said wafer comprises a monocrystalline silicon.

4. The method of claim 1, wherein said thin junction receiving layer comprises a thin N+ type drain region.

5. The method of claim 4, wherein said thin junction receiving layer comprises an N− type epitaxially grown layer atop said thin N+ type drain region.

6. The method of claim 1, wherein said removing said bulk of said wafer includes grinding and etching to said etch stop layer.

7. The method of claim 1 further comprising:
   forming a via through said thin junction receiving layer;
   filling said via with a conductive material to connect at least one of said spaced contacts to said conductive layer on said exposed bottom surface of said wafer.

8. The method of claim 1, wherein said conductive layer comprises copper.

9. The method of claim 8, wherein said copper has a thickness greater than about 10 micrometers.

10. The method of claim 1 wherein said wafer has a thickness greater than about 300 micrometers.

11. The method of claim 1 wherein said thin junction receiving layer has a thickness less than about 10 micrometers.

12. The method of claim 1 wherein said spaced contacts are substantially coplanar.

13. The method of claim 1 wherein said wafer carrier provides sufficient strength to said thin junction receiving layer to allow handling without damage.

14. The method of claim 1 wherein said metallization of said exposed bottom surface comprises metallizing with said conductive layer of sufficient thickness and strength to allow handling without damage.

15. A method for manufacturing a semiconductor device comprising:
   forming an etch stop layer in a top surface of a silicon wafer;
   forming a thin junction receiving layer of silicon atop said etch stop layer;
   forming a junction pattern in said thin junction receiving layer;
   forming spaced contacts atop said junction pattern;
   attaching a wafer carrier mount to a top surface of said junction pattern, wherein said wafer carrier mount functions to provide a mechanical wafer strength to said wafer;
   removing a bulk of said wafer from a bottom of said wafer to said etch stop layer;
   metallizing an exposed bottom surface of said junction pattern with a conductive layer; and
   removing said wafer carrier mount.

16. The method of claim 15, wherein said thin junction receiving layer of silicon comprises a thin $N^+$ type drain region.

17. The method of claim 16 wherein said thin junction receiving layer comprises an $N^-$ type epitaxially grown layer atop said thin $N^+$ type drain region.

18. The method of claim 15 further comprising:
   forming a via through said thin junction receiving layer of silicon;
   filling said via with a conductive material to connect at least one of said spaced contacts to said conductive layer on said exposed bottom surface of said wafer.

* * * * *